(12) United States Patent
Van Dijck et al.

(10) Patent No.: US 7,221,430 B2
(45) Date of Patent: May 22, 2007

(54) LITHOGRAPHIC APPARATUS AND DEVICE MANUFACTURING METHOD

(75) Inventors: Hendrikus Alphonsus Ludovicus Van Dijck, Veldhoven (NL); Christian Wagner, Eersel (NL); Laurentius Catrinus Jorritsma, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 214 days.

(21) Appl. No.: 10/842,634

(22) Filed: May 11, 2004

(65) Prior Publication Data

US 2005/0254024 A1    Nov. 17, 2005

(51) Int. Cl.
G03B 27/52 (2006.01)
G03B 27/72 (2006.01)
(52) U.S. Cl. .......................................... 355/30; 355/69
(58) Field of Classification Search .................. 355/30, 355/53, 55, 67–71; 250/548; 356/399–401
See application file for complete search history.

(56) References Cited

U.S. PATENT DOCUMENTS

| 4,666,273 | A | * | 5/1987 | Shimizu et al. | 353/101 |
|---|---|---|---|---|---|
| 5,661,546 | A | * | 8/1997 | Taniguchi | 355/53 |
| 5,677,757 | A | * | 10/1997 | Taniguchi et al. | 355/71 |
| 6,040,894 | A | * | 3/2000 | Takahashi | 355/53 |
| 6,078,380 | A | * | 6/2000 | Taniguchi et al. | 355/52 |
| 6,414,743 | B1 | * | 7/2002 | Nishi et al. | 355/69 |
| 6,549,266 | B1 | * | 4/2003 | Taniguchi | 355/53 |

* cited by examiner

*Primary Examiner*—Henry Hung Nguyen
(74) *Attorney, Agent, or Firm*—Pillsbury Winthrop Shaw Pittman LLP

(57) ABSTRACT

A lithographic apparatus includes an instrument for determining the radiation intensity distribution at a pupil plane of the projection system while a patterning device is imparting the projection beam with a pattern, a calculation apparatus for calculating the effect on the imaging by the projection system of heating resulting from the projection beam in the projection system having the determined intensity distribution and a controller for adjusting the lithographic apparatus to compensate for the calculated effect of heating.

12 Claims, 3 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Discussion of Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

In a lithographic apparatus there is inevitably some absorption of the radiation as it passes through the projection system, such as a projection lens, which images the patterned radiation onto the substrate. This causes heating of the projection lens which results in lens aberration and so is detrimental to the imaging performance. Some attempts have been made to alleviate this, for example, by using feed-forward models which endeavour to predict the heating effect and resultant aberration such that compensation can be applied to correct for the predicted aberration. However, current models are only approximate and coarse, for example only using the average reticle transmission, illumination mode and numerical aperture as parameters. This excludes diffraction effects of the reticle and may also not be a valid model for more sophisticated reticles such as ones with differential attenuation and phase-shift masks. This leads to large residual errors after the feed-forward model is applied. Consequently, feed-back measurements of the actual aberration are periodically necessary in order to correct for the residual errors in the predicted lens aberration, such that the performance of the projection lens can be maintained within the required specification. However, these feed-back measurements result in a significant throughput penalty.

In order to predict more accurately the effect of lens heating, caused by the passage of radiation, on the aberration of the projection lens, one needs information on the spatial distribution of radiation within the projection lens. Radiation enters the projection lens at a variety of angles and this determines the spatial distribution of radiation at a pupil plane within the projection lens. The two dimensional intensity distribution at the pupil plane is known as the pupil filling.

Another problem is that some chips can be very complex, for example with a DRAM part and a logic part. The corresponding reticle will have different transmission and different features for the different parts, which leads to different pupil filling along the slit used in a scanner apparatus. Similarly, if only a small chip is being imaged, only a portion of the field will be bright and the rest will be dark. There is a problem regarding how to include these effects in the feed-forward model; if they are not included, this can cause errors in the calculated aberration.

A further factor is that measurement of the pupil filling of the projection lens has previously required extra items to be inserted into the machine and/or extensive measurement analysis. This can mean that the measurement is slow or indirect. Measurement of the scanning pupil in a scanner has also been difficult.

SUMMARY OF THE INVENTION

According to an aspect of the invention, there is provided a lithographic apparatus including: an illumination system for providing a projection beam of radiation, a support structure for supporting a patterning device, the patterning device serving to impart the projection beam with a pattern in its cross-section, a substrate table for holding a substrate, and a projection system for projecting the patterned beam onto a target portion of the substrate, an instrument for determining the radiation intensity distribution at a pupil plane of the projection system while a patterning device is imparting the projection beam with a pattern, a calculation apparatus for calculating the effect on the imaging by the projection system of heating resulting from the projection beam in the projection system having the determined intensity distribution, and a controller for adjusting the lithographic apparatus to compensate for the calculated effect of heating.

According to a further aspect of the invention, there is provided a device manufacturing method including: providing a substrate, providing a projection beam of radiation using an illumination system, using a patterning device to impart the projection beam with a pattern in its cross-section, and projecting the patterned beam of radiation onto a target portion of the substrate using a projection system, determining the radiation intensity distribution at a pupil plane of the projection system while the patterning device is imparting the projection beam with a pattern, calculating the effect on the imaging by the projection system of heating resulting from the projection beam in the projection system having the determined intensity distribution, and compensating for the calculated effect of heating.

This apparatus and method of the invention are advantageous because they use actual measurements of the intensity distribution (also referred to as pupil filling) with the patterning device in situ, to provide improved prediction of the lens heating aberration effects. This improves the feed-forward correction and reduces the number of feed-back measurements which are required, thereby improving throughput.

According to a further aspect of the invention, there is provided a device manufactured according to the above-referenced device manufacturing method.

According to a further aspect of the invention there is provided a method of obtaining information on the radiation intensity distribution at a pupil in a lithographic apparatus, the lithographic apparatus comprising: an illumination system for providing a projection beam of radiation, a support structure for supporting patterning device, the patterning device serving to impart the projection beam with a pattern in its cross-section, a substrate table for holding a substrate, a projection system for projecting the patterned beam onto a target portion of the substrate, and an adjustable aperture for changing the numerical aperture of the projection system, measuring the irradiance at the substrate table for a plurality of different numerical aperture values.

In certain embodiments, information on the radiation intensity distribution can be obtained without inserting any additional tools or components into the apparatus. This means that the measurement can be rapid.

In certain embodiments, the method further includes determining the numerical aperture value at which the irradiance is a predetermined proportion of the value when the numerical aperture is at its maximum. This enables quick monitoring of, for example, the sigma-inner and sigma-outer settings by appropriate choice of the value of the predetermined proportion.

In certain embodiments, the method further includes determining the derivative of the irradiance measurements as a function of the numerical aperture to obtain information on the intensity distribution at a pupil plane of the projection system (i.e., pupil filling). This enables the pupil filling, azimuthally averaged, to be readily obtained.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5–20 nm).

The term "patterning device" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning devices, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE PRESENT INVENTION

Embodiment 1

Figure 1:
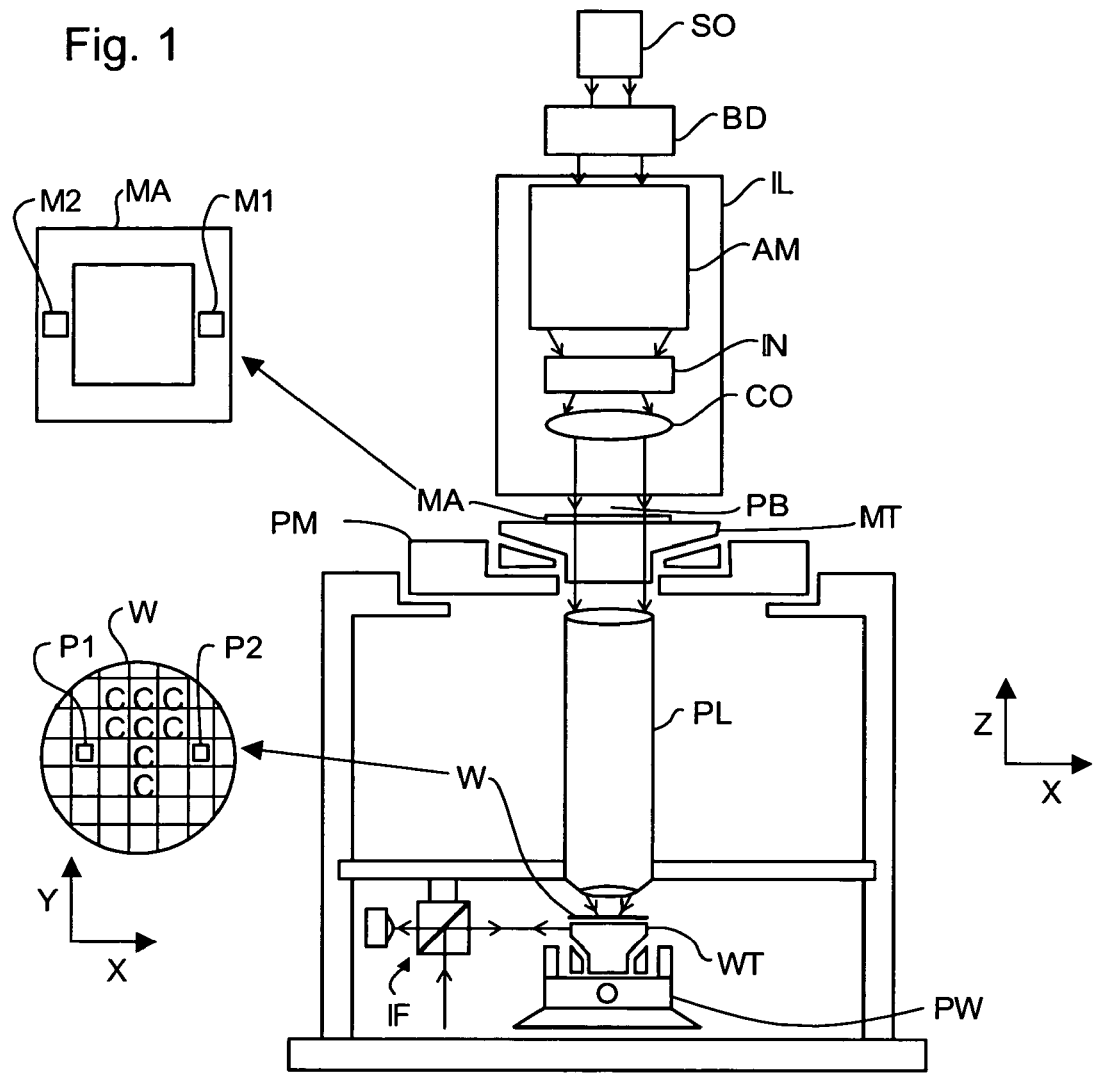
FIG. 1 depicts a lithographic apparatus according to an embodiment of the invention.

FIG. 1 schematically depicts a lithographic apparatus according to a particular embodiment of the invention. The apparatus includes:

an illumination system (illuminator) IL for providing a projection beam PB of radiation (e.g., UV radiation or EUV radiation).

a first support structure (e.g., a mask table) MT for supporting a patterning device (e.g., a mask) MA and connected to a first positioner PM for accurately positioning the patterning device with respect to item PL;

a substrate table (e.g., a wafer table) WT for holding a substrate (e.g., a resist-coated wafer) W and connected to a second positioner PW for accurately positioning the substrate with respect to item PL; and a projection system (e.g., a refractive projection lens) PL for imaging a pattern imparted to the projection beam PB by the patterning device MA onto a target portion C (e.g., comprising one or more dies) of the substrate W.

As here depicted, the apparatus is of a transmissive type (e.g., employing a transmissive mask). Alternatively, the apparatus may be of a reflective type (e.g., employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjustable optical elements AM for adjusting the angular intensity distribution of the beam. Generally, at least the outer and/or inner radial extent (commonly referred to as σ-outer and σ-inner, respectively, or sigma-outer and sigma-inner) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioner PW and position sensor IF (e.g., an interferometric device), the substrate table WT can be moved accurately, e.g., so as to position different target portions C in the path of the beam PB. Similarly, the first positioner PM and another position sensor (which is not explicitly depicted in FIG. 1) can be used to accurately position the mask MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at once (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e., a single dynamic exposure) through a slit extending in the non-scanning direction. The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

In order to predict the effect of lens heating, caused by the passage of radiation, on the aberration of the projection lens, one needs information on the spatial distribution of radiation within the projection lens. Radiation enters the projection lens at a variety of angles and this determines the spatial distribution of radiation at a pupil plane within the projection lens. The two dimensional intensity distribution at the pupil plane is known as the pupil filling. Previous lens heating feed-forward models did not take into account the angular distribution of projection beam radiation caused by diffraction by the mask MA. Instead they simply used the average reticle transmission, numerical aperture, and illumination mode (e.g., sigma-inner and sigma-outer). One possible way to determine the pupil filling involves taking the Fourier transform of the pattern on the mask MA. The spatial distribution of radiation at the mask MA and at the pupil plane in the projection lens are related by the Fourier transform. However, this is an extensive calculation and would require detailed information on every mask used which may not be readily supplied. Therefore, it is preferred to determine the pupil filling by direct measurement.

Figure 2:
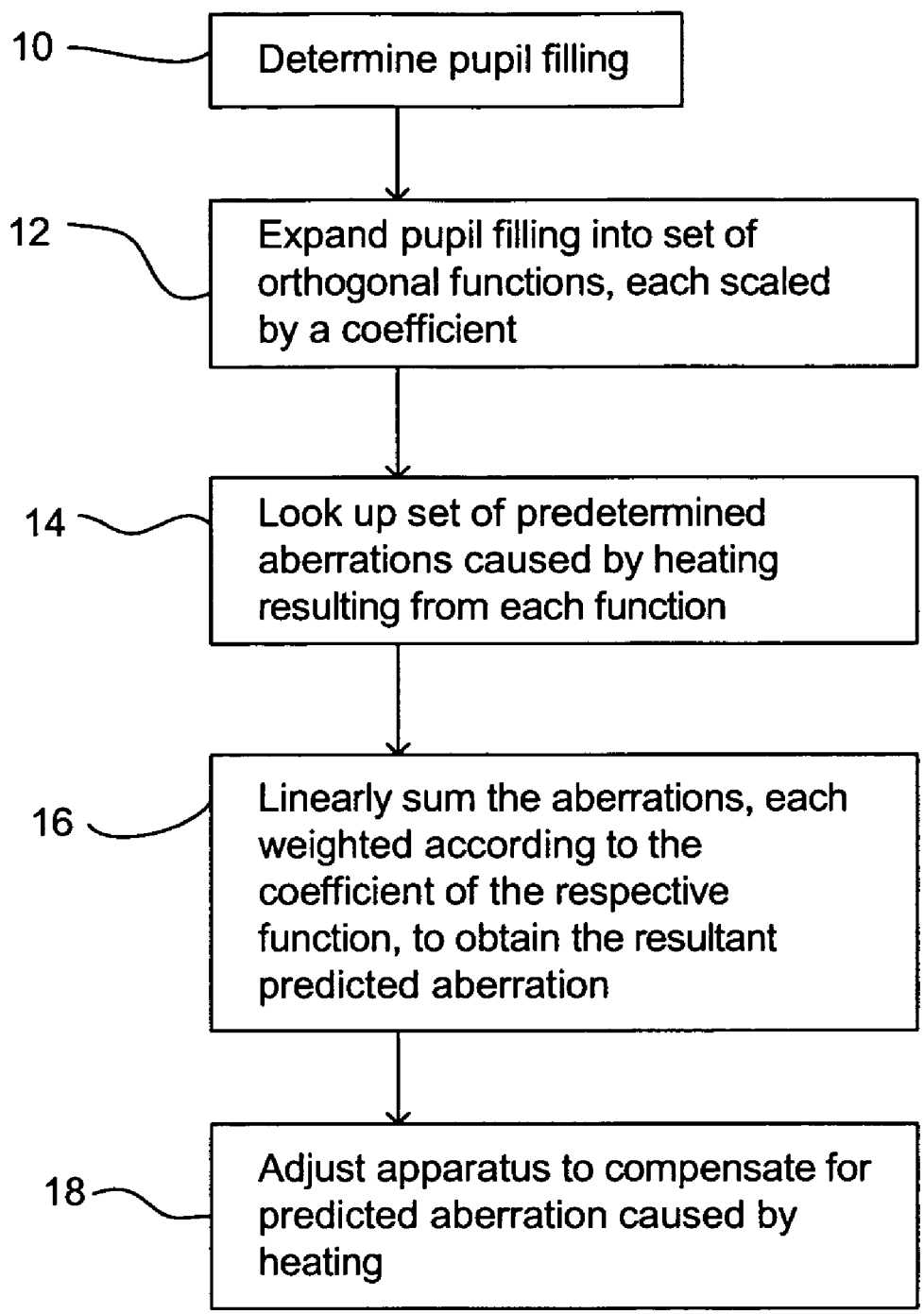
FIG. 2 is a flow chart illustrating a method of operating a lithographic apparatus using a lens heating feed-forward model to correct for aberration according to an embodiment of the invention.

FIG. 2 is a flowchart illustrating a method of operating a lithographic apparatus according to the present embodiment of the invention. The first step in box 10 is to determine the pupil filling.

One technique for determining the pupil filling by direct measurement is to use a pinhole at the plane of the substrate W with a sensor beneath the pinhole and separated by a small distance such that it is defocused with respect to the image of the mask formed at the substrate level W. This arrangement acts as a pinhole camera with the image of the pupil plane in the projection lens being formed at the plane of the defocused sensor. By scanning the sensor beneath the fixed pinhole, the two-dimensional intensity distribution at the pupil, i.e., the pupil filling, can be obtained. The sensor may be an existing spot sensor (dose sensor) already provided in the apparatus.

An alternative arrangement for determining the pupil filling is to use a so-called camera tool, which also comprises a pinhole provided at the substrate level, beneath which is a lens which transforms the angular distribution at the field point selected by the pinhole into a spatial intensity distribution at a sensor position beneath the lens. The sensor in this case has an array of radiation sensitive pixels and, for example, may comprise a charge-coupled device (CCD). This enables an electronic image of the pupil to be obtained. The additional lens makes the image more compact than using a pinhole alone, and thereby reduces the area of the CCD chip that is required. The use of a CCD enables the pupil image to be captured in a single shot, without scanning the sensor.

Further information on determining the pupil filling can be obtained from, for example, EP-A-1,184,727, incorporated herein by reference.

Any other suitable measurement system can be used in which the intensity distribution at a plane conjugate with the pupil plane of the projection lens is obtained. This can be a dedicated sensor or can be a sensor already provided in the apparatus, for example the sensor provided for the system known as an integrated lens interferometer at scanner (IL-IAS), which is an interferometric wave front measurement system, and which uses a sensor camera conjugate with the pupil plane. The measurement system may be referred to as an instrument, whether it uses additional dedicated hardware or whether it uses pre-existing components in the machine.

When determining the pupil filling at step 10, this is done with the mask in situ such that the intensity distribution at the projection lens pupil includes the diffraction effects of the mask. It must also be done with the specific illumination mode (sigma settings etc.) intended for use with that mask. In the case of the apparatus being a scanner, the mask is scanned during the measurement in order to achieve the average diffraction pattern of the full mask. The sensor, such as a CCD integrates the radiation received during the scan. The pupil filling measurement can also optionally be performed at several different locations in the field and averaged.

Having determined the two-dimensional pupil filling data, the next step 12 is to expand it into a linear sum of orthogonal basis functions, each function being scaled by a coefficient, for example:

$$I(r, \theta) = \sum_i a_i P_i(r, \theta)$$

where $I(r, \theta)$ is the pupil filling, r and $\theta$ being the two pupil coordinates, $P_i(r, \theta)$ is the set of orthogonal basis functions, and $\alpha_i$ are the coefficients.

For the case of a scanner, variation in pupil filling or transmission in the slit direction can be sampled by measuring the lens pupil at different slit positions. The resulting pupil filling across the slit can be decomposed into functions describing the pupil as well as the slit distribution:

$$I(x, r, \theta) = \sum_i \sum_j a_i b_j P_i(r, \theta) F_j(x)$$

where $I(x, r, \theta)$ is the pupil filling across the slit, x being the slit position, r and $\theta$ being the two pupil coordinates, $P_i(r, \theta)$ is the set of orthogonal basis functions describing the pupil, $F_j(x)$ is a set of basis functions describing the slit, and $a_i$ and $b_j$ are the coefficients.

In the above expansions, the orthogonal basis functions $P_i$ describing the pupil are preferably Zernike polynomials, but other suitable orthogonal functions can be used, such as Bessel functions. The slit distribution can be described by polynomials.

For each basis function $P_i$ (and $F_j$ where applicable), representing a particular pupil filling, the lens heating induced aberrations are known either by experimental calibration or by simulation such as a transient simulation of the lens heating behavior. Simulation may include ray-tracing using the known properties of the lens elements to determine the power densities on each lens element surface, followed by finite element calculation to obtain the deformation, stress and temperature profiles of the lens elements. The deformations can cause aberration, and the temperature change and stress cause refractive index changes which also result in aberration. The model can include time-dependent effects of the heating on the aberration. This all results in information on the aberration or aberrations caused by the heating pattern for the pupil filling corresponding to that particular function. The aberration can be represented, for example, by a set of Zernike coefficients. The aberration for each basis function are stored in a database. So, as the next step 14, the aberrations corresponding to each function corresponding to the pupil filling determined at step 10 are looked up. Then in step 16, the looked-up aberrations are each weighted according to the coefficient $a_i$ of the respective function $P_i$ (and coefficient $b_j$ of slit functions $F_j$ where applicable) and then linearly summed. The aberrations can be summed linearly because the basis functions are orthogonal so there are no non-linear terms. The result of this sum is the overall aberration predicted by this model. The model can be a feed-forward model, including time-dependent effects of heating on aberration, further details of which are disclosed in EP-A-1164436.

Finally, in step 18, when using the lithographic apparatus to project the image on the mask onto a substrate W, a controller makes adjustments to the apparatus to compensate for the predicted aberration caused by the heating. Examples of adjustments made include moving Z-actuators built into the lens, deformation of lens elements, changing the wavelength of the projection beam radiation, and changing the height (Z position) of the mask and/or substrate; further information is disclosed in EP-A-1164436. The precise changes to be made can also be looked up in a database or calculated using a model which relates the aberration to the adjustment, as already provided on some apparatuses.

As explained previously, the pupil filling depends on the illumination setting, and hence the predicted aberration and correction are only valid for that setting. If the same mask is to be used for performing exposures at different illumination settings, either the pupil filling must be re-measured for each illumination setting, or it is possible to extrapolate or interpolate the pupil filling at the new illumination setting based on previous measurements at one or more different illumination settings.

Embodiment 2

This embodiment of the invention concerns a method for determining information on the pupil of the projection lens. It may be used in some circumstances in conjunction with the preceding embodiment, or may be used independently.

Figure 3:
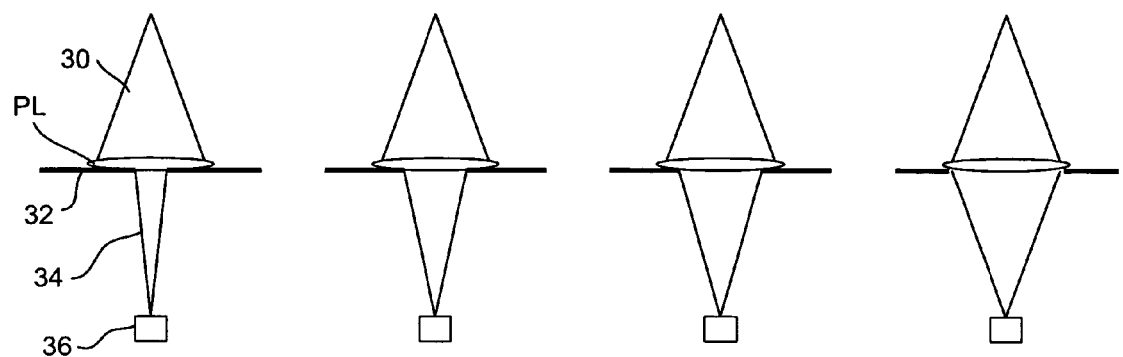
FIG. 3 illustrates schematically the projection lens system with an adjustable aperture in different states for performing a pupil filling measurement according to another embodiment of the invention.

This embodiment is for use with a lithographic apparatus in which the projection lens has an adjustable numerical aperture. FIG. 3 illustrates schematically the projection system comprising a projection lens PL, a cone of radiation 30 from the illuminator, a means for adjustably defining the numerical aperture such as an adjustable diaphragm 32, a cone of radiation 34 exiting the projection lens, and a sensor 36. FIG. 3 shows four different settings of the numerical aperture. The angular aperture is defined as the angle between the most divergent rays that can pass through the lens system to form the image and the numerical aperture (NA) is the sine of half the angular aperture.

The sensor 36 is, for example, a dose sensor already provided in the apparatus and measures the irradiance at substrate level. This measured value is proportional to the total energy passing through the aperture 32 out to the numerical aperture that has been set, i.e., it is the "encircled energy." Measurements are taken at a plurality of different numerical apertures as illustrated in FIG. 3. When the numerical aperture is adjusted to its maximum value $NA_{max}$ the measured irradiance is, by definition, proportional to the maximum encircled energy (i.e., 100%).

Figure 4:
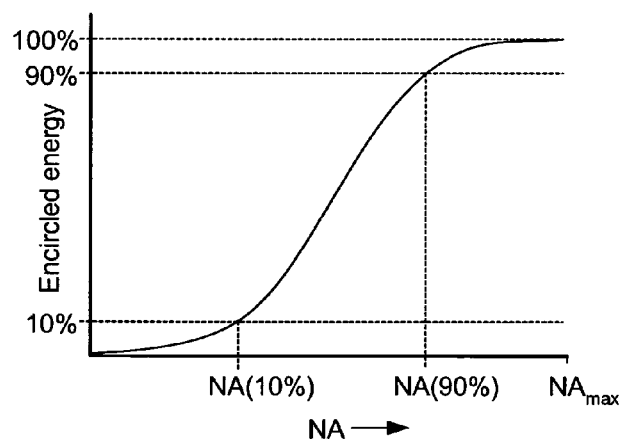
FIG. 4 is a schematic graph of encircled energy against numerical aperture for the measurement according to the embodiment of FIG. 3.

FIG. 4 shows schematically a plot of encircled energy versus numerical aperture (NA) setting. Although it is shown as a continuous curve, in practice it would be a data set of discrete measurement points. From this data the values of the numerical aperture at which the encircled energy is 10% and 90% of the maximum value can be interpolated by standard numerical techniques, giving the values NA(10%) and NA(90%) respectively. These values can then be directly converted to sigma-inner and sigma-outer values: sigma-inner being NA(10%) divided by $NA_{max}$; and sigma-outer being NA(90%) divided by $NA_{max}$. Of course, the values of 10% and 90% are somewhat arbitrary and other thresholds could be used to define the inner and outer radii of an annular illumination mode. Because the measurements are in terms of the numerical aperture, this converts directly to absolute sigma values which are normalized to a value of sigma=1 being the maximum radius of the pupil of the projection lens.

The measurements can be taken either by sequentially increasing the numerical aperture, or decreasing it, or varying it in some other fashion. The whole range of numerical aperture values need not necessarily be used. For example, if it is only desired to find the sigma-outer value, such as for a conventional disc-like illumination mode, or for an annular illumination mode, the numerical aperture can be started at its largest value and then decreased until the irradiance measured by the sensor 36 has decreased by 10% to 90% of its original value. This can be an extremely fast measurement with a test duration of only 10 seconds at one field point. For the case of a scanner apparatus with a scanning pupil, the measurement at each numerical aperture is performed during a scan with the sensor 36 integrating the radiation received from the slit.

Figure 5:
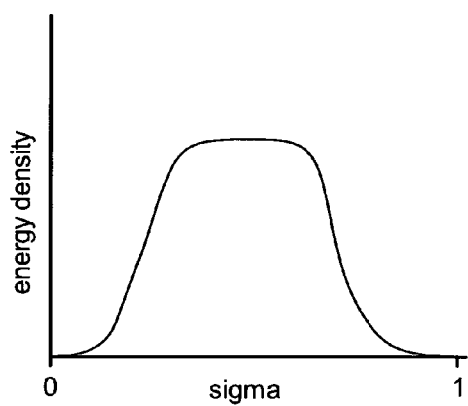
FIG. 5 is a schematic plot of energy density against sigma for a particular illumination mode obtained by differentiating the graph of FIG. 4.

If further details of the pupil filling are required, other than just the sigma-inner and sigma-outer values, this can be obtained by differentiating the encircled energy data of FIG. 4 to obtain a plot shown schematically in FIG. 5. The change in encircled energy from one numerical aperture setting to the next gives the energy located in the annulus between those two numerical aperture settings. Thus, FIG. 5 gives the energy density (intensity distribution) profile as a function of the radial pupil coordinate sigma. In this example, the illumination mode is annular with low intensity at the center and at the outer periphery of the pupil.

It is, of course, apparent that this embodiment of the invention averages the energy around the azimuthal direction and just gives a single average value of energy density at each radius position in the pupil. Therefore it could not be used for high-order aberration measurements, but could nonetheless be useful for rapid intermediate monitoring measurements to show up significant numerical aperture or sigma errors. The technique can also be used to determine the field dependence of the sigma values. This embodiment can be used with or without a mask or other patterning device present. If a mask is not present, it can directly measure the illumination source generated by the illuminator, i.e., the illuminator pupil rather than the projection lens pupil.

The lithographic apparatus according to the previously described embodiments of the invention can be a standard apparatus, for example Embodiment 2 does not require any additional hardware. The calculation apparatus for calculating the heating effect and lens aberration in Embodiment 1 and for determining the pupil information in Embodiment 2 can be implemented in software running on either a dedicated computer or on the computer used for controlling other aspects of the lithographic apparatus.

While specific embodiments of the invention have been described above, it will be appreciated that the invention may be practiced otherwise than as described. The description is not intended to limit the invention.

The invention claimed is:

1. A lithographic apparatus comprising:
   an illumination system for providing a projection beam of radiation;
   a support structure for supporting a patterning device, the patterning device serving to impart the projection beam with a pattern in its cross-section;
   a substrate table for holding a substrate;
   a projection system for projecting the patterned beam onto a target portion of the substrate,
   a sensor module, configured and arranged to determine a spatial radiation intensity distribution at a pupil plane of the projection system while a patterning device is imparting the projection beam with a pattern;
   a calculation module, configured and arranged to calculate an effect on the imaging by the projection system of heating resulting from the projection beam in the projection system having the determined intensity distribution; and
   a controller, configured and arranged to adjust the lithographic apparatus to compensate for the calculated effect of heating.

2. A lithographic apparatus according to claim 1, wherein the calculation module is arranged to expand the intensity distribution into a set of orthogonal functions, each function scaled by a coefficient.

3. A lithographic apparatus according to claim 2, wherein the calculation module further comprises a previously calculated database of aberrations resulting from the passage of radiation with a spatial, radiation intensity distribution corresponding to each of said functions.

4. A lithographic apparatus according to claim 3, wherein the calculation module is arranged to sum the aberrations read from the database, each weighted according to the respective coefficient.

5. A lithographic apparatus according to claim 1, wherein: the lithographic apparatus comprises a scanner slit; wherein the apparatus is also configured to determine a variation in transmission along the slit; and wherein the calculation module is further arranged to expand the intensity distribution into a set of functions describing the slit intensity distribution, each function scaled by a coefficient.

6. A lithographic apparatus according to claim 1, wherein the calculation module and controller are used to adjust the lithographic apparatus within a feed-forward model.

7. A device manufacturing method comprising:
patterning a projection beam with a pattern in its cross-section;
projecting the patterned beam of radiation onto a target portion of a substrate using a projection system;
determining a spatial radiation intensity distribution at a pupil plane of the projection system while a patterning device is imparting the projection beam with the pattern;
calculating an effect on the imaging by the projection system of heating resulting from the projection beam in the projection system having the determined intensity distribution; and
compensating for the calculated effect of heating.

8. A method according to claim 7, wherein calculating the effect on the imaging comprises expanding the intensity distribution into a set of orthogonal functions, each function scaled by a coefficient.

9. A method according to claim 8, further comprising reading aberration information from a previously calculated database of aberrations resulting from the passage of radiation with a spatial radiation intensity distribution corresponding to each of said functions.

10. A method according to claim 9, further comprising summing the aberrations read from the database, each weighted according to the respective coefficient.

11. A method according to claim 7, wherein: the projection system comprises a scanner slit; further comprising determining the variation in transmission along the slit; and expanding the intensity distribution into a set of functions describing the slit intensity distribution, each function scaled by a coefficient.

12. A method according to claim 7, wherein the calculating and controlling are used to adjust the lithographic apparatus within a feed-forward model.

* * * * *